(12) United States Patent
Li et al.

(10) Patent No.: US 12,703,604 B2
(45) Date of Patent: Aug. 11, 2026

(54) APPARATUS AND METHOD FOR TESTING ELEVATOR DISPLAY UNIT AND ELEVATOR SYSTEM

(71) Applicant: Otis Elevator Company, Farmington, CT (US)

(72) Inventors: Bichun Li, Shanghai (CN); Fu Qi, Shanghai (CN); Shenhong Wang, Shanghai (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 1301 days.

(21) Appl. No.: 17/531,445

(22) Filed: Nov. 19, 2021

(65) Prior Publication Data

US 2022/0411227 A1 Dec. 29, 2022

(30) Foreign Application Priority Data

Jun. 23, 2021 (CN) ......................... 202110699773.3

(51) Int. Cl.
*B66B 5/00* (2006.01)
*G01R 31/26* (2020.01)

(52) U.S. Cl.
CPC ........ *B66B 5/0025* (2013.01); *G01R 31/2635* (2013.01)

(58) Field of Classification Search
CPC ....... B66B 5/0025; B66B 3/00; B66B 5/0087; G01R 31/2635; G01R 19/2503; G08C 17/02
See application file for complete search history.

(56) References Cited

U.S. PATENT DOCUMENTS 4,898,263 A 2/1990 Manske et al.
4,958,707 A 9/1990 Yoneda et al.
(Continued)

FOREIGN PATENT DOCUMENTS

CN 101246659 A 8/2008
CN 203192361 U * 9/2013
(Continued)

OTHER PUBLICATIONS

European Search Report for Application No. 21213863.0, Issued May 30, 2022, 6 Pages.

*Primary Examiner* — Uzma Alam
(74) *Attorney, Agent, or Firm* — CANTOR COLBURN LLP

(57) ABSTRACT

A detection device and a detection method for an elevator display module, an elevator including the detection device, and a computer storage medium. The detection device includes: memory; a processor; an I/O interface, configured to be coupled with one or more electroluminescent devices of the elevator display module; a communication module; and a computer program stored on the memory and running on the processor, the running of the computer program causes: receiving a detection request signal for the elevator display module via the communication module; in response to the detection request signal, applying a detection signal on at least one of the electroluminescent devices via the I/O interface; obtaining an operating level associated with the detected electroluminescent device via the I/O interface; and determining whether the detected electroluminescent device is working normally according to a polarity of the operating level.

20 Claims, 6 Drawing Sheets

(56) References Cited

U.S. PATENT DOCUMENTS

| | | | | |
|---|---|---|---|---|
| 10,644,378 | B1 * | 5/2020 | Lu | H03F 3/19 |
| 2015/0293799 | A1 * | 10/2015 | Sekine | B66B 5/0006 714/37 |
| 2016/0257528 | A1 | 9/2016 | Kirchhoff et al. | |
| 2019/0018057 | A1 * | 1/2019 | Pappas | G01R 1/07342 |
| 2020/0013318 | A1 * | 1/2020 | Pappas | G01R 31/2635 |
| 2021/0311117 | A1 * | 10/2021 | De Cicco | H05B 45/37 |

FOREIGN PATENT DOCUMENTS

| | | | | | |
|---|---|---|---|---|---|
| CN | 108545562 | A | | 9/2018 | |
| CN | 108584585 | A | | 9/2018 | |
| CN | 207820275 | U | * | 9/2018 | |
| CN | 110027951 | A | * | 7/2019 | B66B 5/0025 |
| EP | 3412615 | A2 | | 12/2018 | |
| JP | H07157227 | A | | 6/1995 | |
| JP | H10167599 | A | | 6/1998 | |
| JP | 2000293766 | A | | 10/2000 | |
| JP | 2001058769 | A | | 3/2001 | |
| JP | 2006264890 | A | | 10/2006 | |
| KR | 0167161 | B1 | | 12/1998 | |
| KR | 100186374 | B1 | | 4/1999 | |
| KR | 20000012117 | U | | 7/2000 | |
| KR | 20020064643 | A | | 8/2002 | |
| KR | 100869908 | B1 | | 11/2008 | |
| KR | 100949516 | B1 | * | 3/2010 | G09F 9/33 |
| KR | 102064892 | B1 | * | 1/2020 | G06Q 50/10 |
| WO | 2009010481 | A1 | | 1/2009 | |
| WO | 2020174631 | A1 | | 9/2020 | |
| WO | WO-2020191537 | A1 | * | 10/2020 | G09G 3/00 |

* cited by examiner

APPARATUS AND METHOD FOR TESTING ELEVATOR DISPLAY UNIT AND ELEVATOR SYSTEM

FOREIGN PRIORITY

This application claims priority to Chinese Patent Application No. 202110699773.3, filed Jun. 23, 2021, and all the benefits accruing therefrom under 35 U.S.C. § 119, the contents of which in its entirety are herein incorporated by reference.

TECHNICAL FIELD

The present application relates to the field of elevator call system detection, and particularly, a detection device and a detection method for an elevator display module, an elevator system including the detection device, and a computer storage medium that implements the detection method.

BACKGROUND

LED display screens and other elevator display modules are usually used in the elevator hall floor to implement indication of various information, such as elevator running direction, floor, stop/running status, overloaded or not, button status, etc. In order to ensure the normal operation of LED display screens, etc., regular one-by-one click-checks are required, which will take maintenance personnel a lot of time. Therefore, an elevator display module detection solution that can save maintenance personnel's time and improve its detection efficiency is urgently needed.

SUMMARY

The embodiments of the present application provide a detection device, a detection method, an elevator system, and a computer storage medium for an elevator display module, which can efficiently detect the failure of the elevator display module.

According to one aspect of the present application, there is provided a detection device for an elevator display module, comprising: memory; a processor; an I/O interface, configured to be coupled with one or more electroluminescent devices of the elevator display module; a communication module; and a computer program stored on the memory and running on the processor, the running of the computer program causes:

receiving a detection request signal for the elevator display module via the communication module; in response to the detection request signal, applying a detection signal on at least one of the electroluminescent devices via the I/O interface;

obtaining an operating level associated with the detected electroluminescent device via the I/O interface; and determining whether the detected electroluminescent device is working normally according to a polarity of the operating level.

In some embodiments of the present application, optionally, the detection device is an elevator control module for realizing elevator dispatching and control functions or a device dedicated to controlling elevator display.

In some embodiments of the present application, optionally, the detection request signal is received from a user terminal via a wireless network, or the detection request signal is received from an elevator control cabinet of an elevator system via a wireless network or a wired network.

In some embodiments of the present application, optionally, the detection request signal includes an equipment identification of the elevator display module or the detection device.

In some embodiments of the present application, optionally, the detection request signal includes an identification of the electroluminescent device in the elevator display module.

In some embodiments of the present application, optionally, the running of the computer program further causes:

sending a message about whether the detected electroluminescent device is working normally to the user terminal or the elevator control cabinet via the communication module.

In some embodiments of the present application, optionally, the electroluminescent device is a light emitting diode, the I/O interface includes a plurality of first ports and a plurality of second ports, each of the first ports is configured to be coupled with the first end of the respective corresponding light emitting diode to apply the detection signal, and each of the second ports is configured to be coupled with the second end of the respective corresponding light emitting diode to obtain the operating level.

In some embodiments of the present application, optionally, the detection device further includes a combinational logic circuit, the electroluminescent device is a light emitting diode, and the I/O interface includes a plurality of first ports and one or more second ports, each of the first ports is configured to be coupled with the first pole of the respective corresponding light emitting diode to apply the detection signal, and an input terminal of the combinational logic circuit is configured to be coupled with the second pole of the plurality of light emitting diodes, at least one of the second ports is configured to be coupled with an output terminal of the combinational logic circuit to obtain the operating level.

In some embodiments of the present application, optionally, the detection signal is a drive signal or a reset signal.

According to another aspect of the present application, there is provided an elevator system, comprising: elevator control cabinet; and any detection device as described above.

In some embodiments of the present application, optionally, the elevator control cabinet is configured to periodically send the detection request signal to the detection device, and receive and store a message about whether the detected electroluminescent device is working normally sent by the detection device.

In some embodiments of the present application, optionally, the elevator control cabinet is configured to in response to an elevator display module test request from a user terminal or a remote server, send the detection request signal to the detection device, receive and forward to the user terminal or the remote server the message about whether the detected electroluminescent device is working normally sent by the detection device.

According to another aspect of the present application, there is provided a detection method for an elevator display module, the elevator display module includes one or more electroluminescent devices, and the method comprises the following steps performed by the detection device: receiving a detection request signal for the elevator display module; in response to the detection request signal, applying a detection signal on at least one of the electroluminescent devices; obtaining an operating level associated with the detected electroluminescent device; and determining whether the detected electroluminescent device is working normally according to a polarity of the operating level.

In some embodiments of the present application, optionally, the detection method further comprises: sending a message about whether the detected electroluminescent device is working normally to the user terminal or the elevator control cabinet.

In some embodiments of the present application, optionally, the electroluminescent device is a light emitting diode, and the operating level is a signal at an anode or cathode of the light emitting diode.

In some embodiments of the present application, optionally, the electroluminescent device is a light emitting diode, and the operating level is a logical combination of signals at the anode or the cathode of a plurality of light emitting diodes.

According to another aspect of the present application, there is provided a computer-readable storage medium having instructions stored in the computer-readable storage medium, wherein, when the instructions are executed by a processor, the processor is caused to execute any detection method as described above.

DESCRIPTION OF THE DRAWINGS

From the following detailed description in conjunction with the accompanying drawings, the above and other objects and advantages of the present application will be more complete and clear, wherein the same or similar elements are represented with the same reference numerals.

DETAILED DESCRIPTION

For brevity and illustrative purposes, the application mainly refers to its exemplary embodiments to describe the principles of the present application. However, those skilled in the art will easily recognize that the same principle can be equally applied to all types of detection methods and detection devices for elevator display modules, elevators, and storage media, and these same or similar principles can be implemented therein, any such changes do not depart from the true spirit and scope of this application.

In this specification, terms such as "comprising" and "including" mean that in addition to units and steps that are directly and clearly stated in the specification and claims, the technical solution of this application does not exclude the presence of other units and steps that are not directly and clearly stated in the specification and claims.

In this specification, terms such as "first" and "second" do not indicate the order of the units in terms of time, space, size, etc., but are merely used to distinguish the units.

In this specification, "coupling" should be understood to include the case where electrical energy or electrical signals are directly transmitted between two units, or the case where electrical energy or electrical signals are indirectly transmitted through one or more third units.

In the embodiment described in the specification, the elevator display module may include one or more electroluminescent devices according to the needs of display content. As a typical example of an electroluminescent device, it may be a light emitting diode (LED).

According to one aspect of the present application, a detection device for an elevator display module is provided. Optionally, the detection device shown in FIG. 1 may be an elevator control module (such as an embedded system) for realizing elevator dispatching and control functions or a device dedicated to controlling elevator display. Generally speaking, elevator control modules, such as embedded systems, have abundant port resources, which allow sufficient I/O ports to perform detection tasks of the elevator display module. Since the elevator control module that realizes the elevator dispatching and control functions is an indispensable unit in the elevator system, the use of this module to realize the function of the detection device can make full use of the existing hardware resources; in addition, because only a small amount of modification to software and hardware can provide testing capability, so it is helpful to speed up the development process and upgrade the detecting function of existing elevators in stock.

Figure 1:
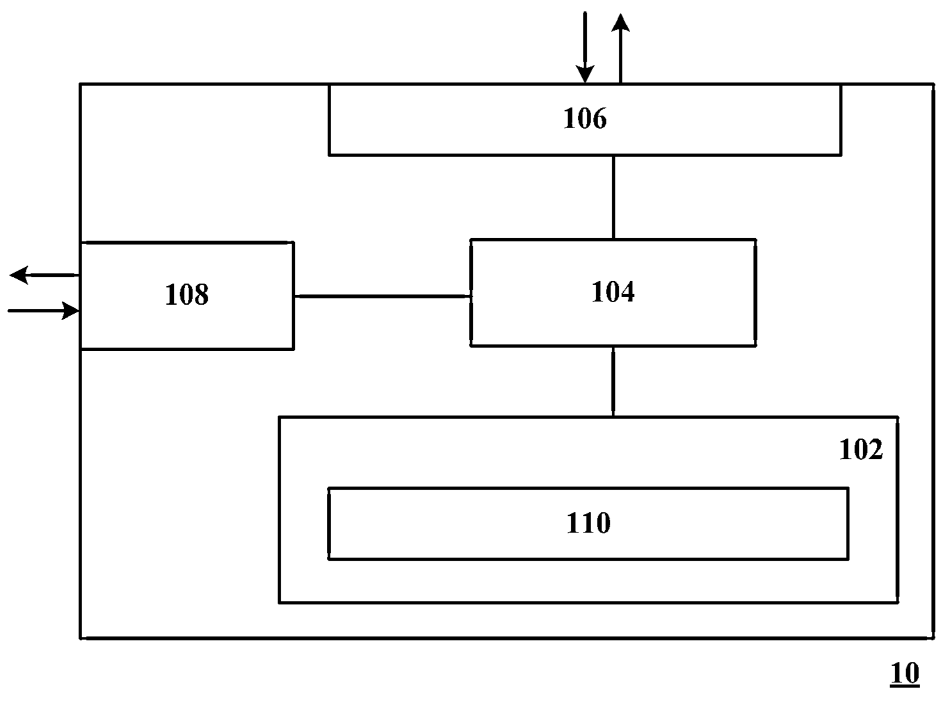
FIG. 1 schematically shows a detection device for an elevator display module according to an embodiment of the present application.

The detection device 10 shown in FIG. 1 can be configured to detect a different number of elevator display modules to suit different application scenarios. These application scenarios include, but are not limited to: detecting elevator display modules on the same hall floor of multiple elevators; detecting elevator display modules on one hall floor of the same elevator; detecting elevator display modules on multiple hall floors of the same elevator; and detecting elevator display modules on multiple hall floors of multiple elevators.

As shown in FIG. 1, a detection device 10 for an elevator display module (hereinafter referred to as the detection device 10) includes memory 102, a processor 104, an I/O interface 106 including multiple I/O ports (for example, GPIO ports), a communication module 108 and a computer program 110 that is stored on the memory 102 and can run on the processor 104.

The detection of the elevator display module can be performed by running the computer program 110 on the processor 104 (for example, as an embodiment of the detection process described below with reference to FIG. 5).

When the computer program 110 is run on the processor 104, the detection device 10 receives a detection request signal for the elevator display module via the communication module 108.

Optionally, the detection request signal may include the equipment identification of the elevator display module to be detected, or the equipment identification of the detection device that detects the elevator display module. When there are multiple elevator display modules or detection devices, the elevator display module (for example, the elevator display module on a specific floor) that you want to be detected can be specified by including the equipment identification in the detection request signal.

Optionally, the detection request signal may further include an identifier of the electroluminescent device in the elevator display module to be detected, so that only the electroluminescent device specified in the detection request signal can be detected.

It should be pointed out that the "specified" mentioned here includes the explicit indication of the electroluminescent device to be detected (for example, the identifier of the corresponding electroluminescent device is included in the detection request signal) and the implicit indication of the electroluminescent device to be detected (for example, the default value of the detection request signal represents the detection of all electroluminescent devices).

Exemplarily, the detection request signal may come from a user terminal or an elevator control cabinet. The communication module 108 may communicate with the user terminal or the elevator control cabinet via a wireless communication method or a wired communication method to receive a detection request signal from the user terminal or the elevator control cabinet.

In response to the received detection request signal, the processor 104 may apply a detection signal, such as a drive signal or a reset signal, on the electroluminescent device via the I/O interface 106. On the other hand, the processor 104 also obtains the operating level associated with the detected electroluminescent device via the I/O interface 106. The operating level described herein may be a level signal at a certain point on the circuit where the electroluminescent device is located (for example, the level signal at an anode or cathode of the electroluminescent device).

Since both the detection signal applied via the I/O interface and the obtained operating level can be digital signals, it is suitable for processing by digital logic processing circuits (for example, processors) without preprocessing the signals (for example, A/D conversion, D/A conversion and signal amplification, etc.). This reduces the complexity of the circuit structure and also saves hardware costs.

Optionally, the I/O interface 106 of the detection device 10 includes a plurality of first I/O ports 106A (for example, ports O1-O7 in FIGS. 2A, 2B, 3A, and 3B) and a plurality of second I/O ports 106B (for example, ports I1-I7 in FIGS. 2A, 2B, 3A, and 3B). In one implementation, the first I/O port 106A is coupled with the first pole of the electroluminescent device (for example, the anodes of D1-D7 in FIG. 2A or the cathodes of D1-D7 in FIG. 2B), and the second I/O port 506A is coupled with the second pole of the electroluminescent device (for example, the cathodes of D1-D7 in FIG. 2A or the anodes of D1-D7 in FIG. 2B). In another implementation, the first I/O port 106A is coupled with the first pole of the electroluminescent device (for example, the anodes of D1-D7 in FIG. 3A or the cathodes of D1-D7 in FIG. 3B), and the second I/O port 106B is coupled with the second poles of a plurality of electroluminescent devices (for example, the cathodes of D1-D7 in FIG. 3A or the anodes of D1-D7 in FIG. 3B) via a combinational logic circuit (for example, the AND circuit G1 in FIG. 3A or the OR circuit G2 in FIG. 3A).

It should be pointed out that the combinational logic circuit can be integrated within the detection device 10 or within the elevator display module.

When obtaining the operating level associated with the electroluminescent device via the second I/O port 106B, the processor 104 determines whether the detected electroluminescent device is working normally according to the polarity of the operating level. The specific method for determining according to the polarity of the operating level will be further described below.

Optionally, the processor 104 may send a message (for example, in the form of a response signal to be described below) about whether the driven electroluminescent device is working normally to the user terminal or the elevator control cabinet via the communication module 108.

FIGS. 2A, 2B, 3A and 3B schematically show schematic diagrams of detecting an elevator display module according to embodiments of the present application.

Figure 2A:
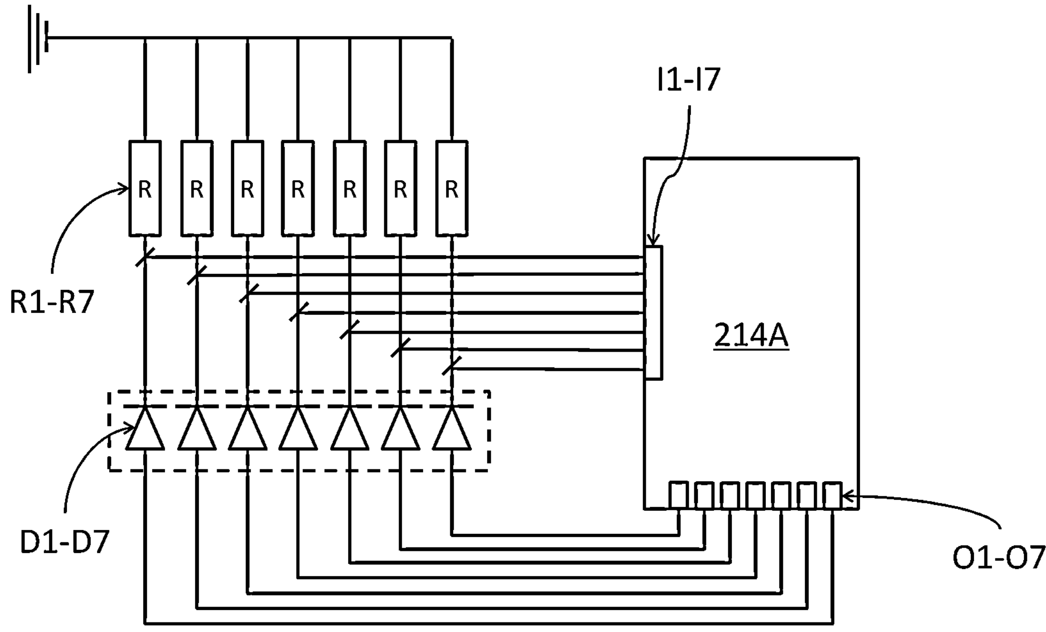
FIGS. 2A, 2B, 3A and 3B schematically show schematic diagrams of detecting an elevator display module according to embodiments of the present application.

As shown in FIG. 2A, it shows an example of the coupling relationship between a seven-segment digital tube used as an elevator display module and the detection device. The detection device 214A shown in FIG. 2A can be implemented by the detection device 10 shown in FIG. 1. The I/O interface of the detection device 214A includes I/O ports O1-O7 and I1-O7, wherein, the I/O ports O1-O7 are used to output and drive level signal of each LED of the seven-segment digital tube (from left to right, D1-D7). Referring to FIG. 2A, the voltage dividing resistors R1-R7 are respectively coupled between the respective corresponding LEDs D1-D7 and the ground. For example, when O2 outputs a high level, if LED D2 works normally, LED D2 will be lit, at this time, the level signal collected between LED D2 and voltage dividing resistor R2 (input to the I/O port I2 of the detection device 214) will be high; if LED D2 fails, LED D2 will not be lit, and the level signal collected between LED D2 and voltage dividing resistor R2 will be low.

The processor of the detection device 214A can send driving signals through the I/O ports O1-O7 to drive the LEDs D1-D7 in response to the detection request signal. If LEDs D1-D7 work normally, LEDs D1-D7 will be lit, at this time, the level signal collected between LEDs D1-D7 and voltage dividing resistors R1-R7 (input to I/O ports I1-I7 of detection device 214A) will be high; if any one of the LEDs D1-D7 fails, the faulty LED will not be lit, at this time, the level signal collected between the faulty LED and the corresponding voltage dividing resistor will be low. Optionally, only when the polarities of the signals collected by the I/O ports I1-I7 are all high, the processor determines that the elevator display module composed of the LEDs D1-D7 is working normally.

Figure 2B:
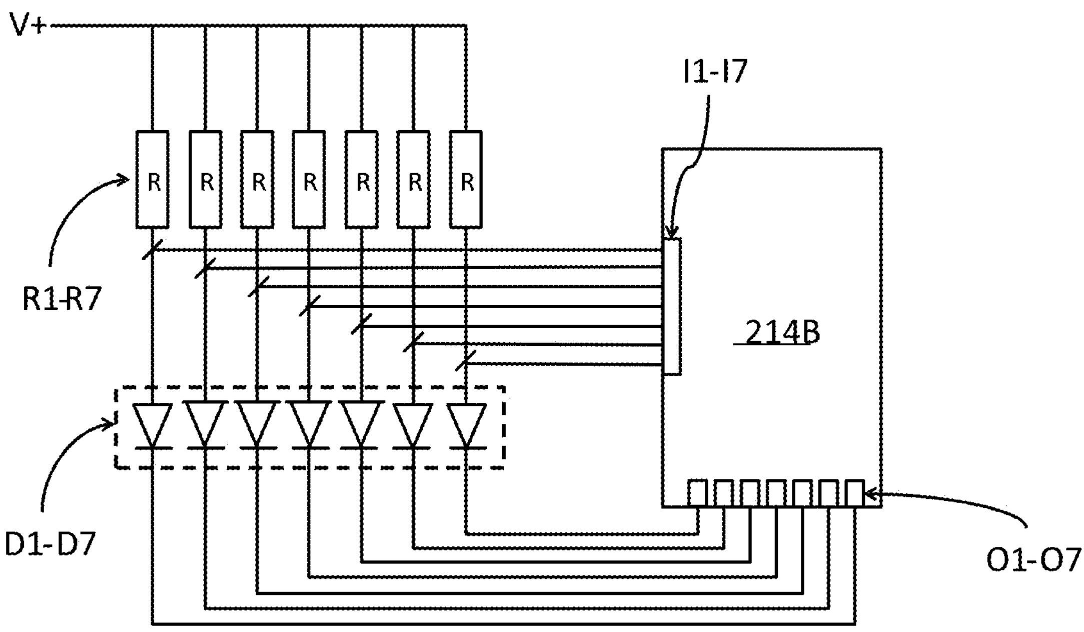

As shown in FIG. 2B, another example of the coupling relationship between a seven-segment digital tube used as an elevator display module and the detection device is shown. Compared with the example in FIG. 2A, the anodes of the LEDs D1-D7 are connected with the constant voltage source V+ via the voltage dividing resistors R1-R7, and the cathodes are respectively connected with the I/O ports O1-O7 of the detection device 214B. For example, when the detection device 214B outputs a low level on the I/O port O2, if the LED D2 works normally, the LED D2 will be lit, at this time, the level signal collected between the LED D2 and the voltage dividing resistor R2 (input to I/O port I2 of the detection device 214B) will be low; if LED D2 fails, LED D2 will not be lit, at this time, the level signal collected between LED D2 and the voltage dividing resistor R2 will be high.

Similarly, the detection device 214B can apply a low level to the cathodes of the LEDs D1-D7 via the I/O ports O1-O7 in response to the detection request signal. If LEDs D1-D7 work normally, LEDs D1-D7 will be lit, at this time, the level signal collected between LEDs D1-D7 and voltage dividing resistors R1-R7 (i.e. the level signal input to ports I1-I7 of detection device 214B) will be low; if any one of the LEDs D1-D7 fails, the faulty LED will not be lit, at this time, the level signal collected between the faulty LED and the corresponding voltage dividing resistor will be high. Optionally, only when the signals collected by the I/O ports I1-I7 are all low, the processor determines that the elevator display module composed of the LEDs D1-D7 is working normally.

In some embodiments of the present application, the fault determination is based on a logical combination of operating levels. For example, compared to the example of FIG. 2A, the example of FIG. 3A does not directly input the operating levels collected between each LED and the voltage dividing resistor to the detection device 314A. The operating levels collected between each LED and the voltage divider resistor are first input to the AND circuit G1 for logical operation, and then the operation result is input to an I/O port of the detection device 314A. When all the LEDs D1-D7 work normally, the collected operating levels are all high, so the result of the AND gate operation will also be high; if any one of the LEDs D1-D7 is not working normally, there will be a low level in the collected operating level, so the result of the AND gate operation will also be low. Therefore, the working status of the elevator display module can be determined according to the result of the logic operation.

Figure 3A:
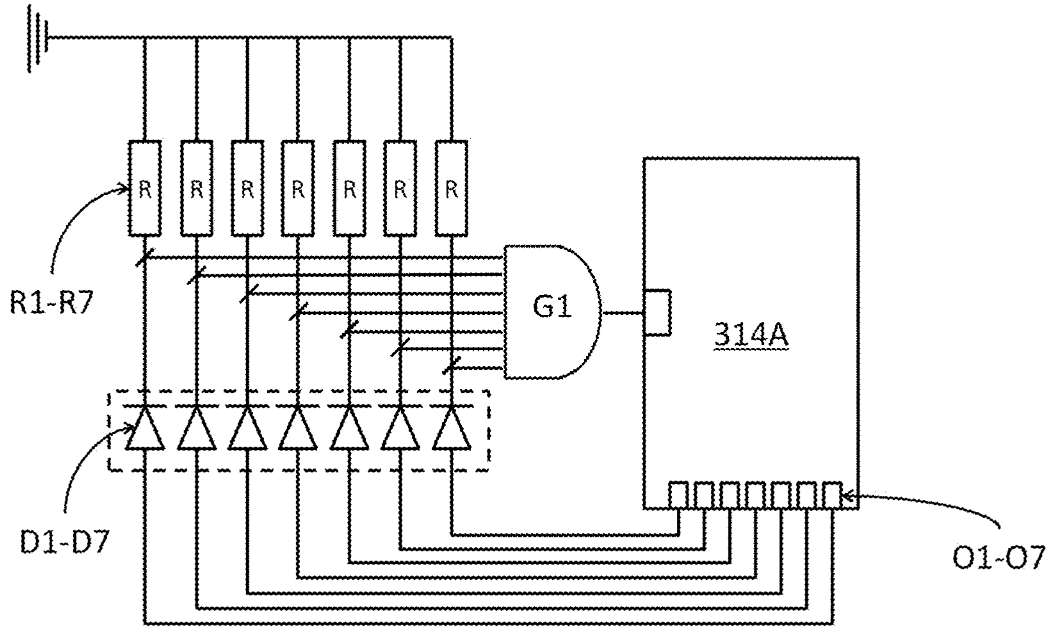
Figure 3B:
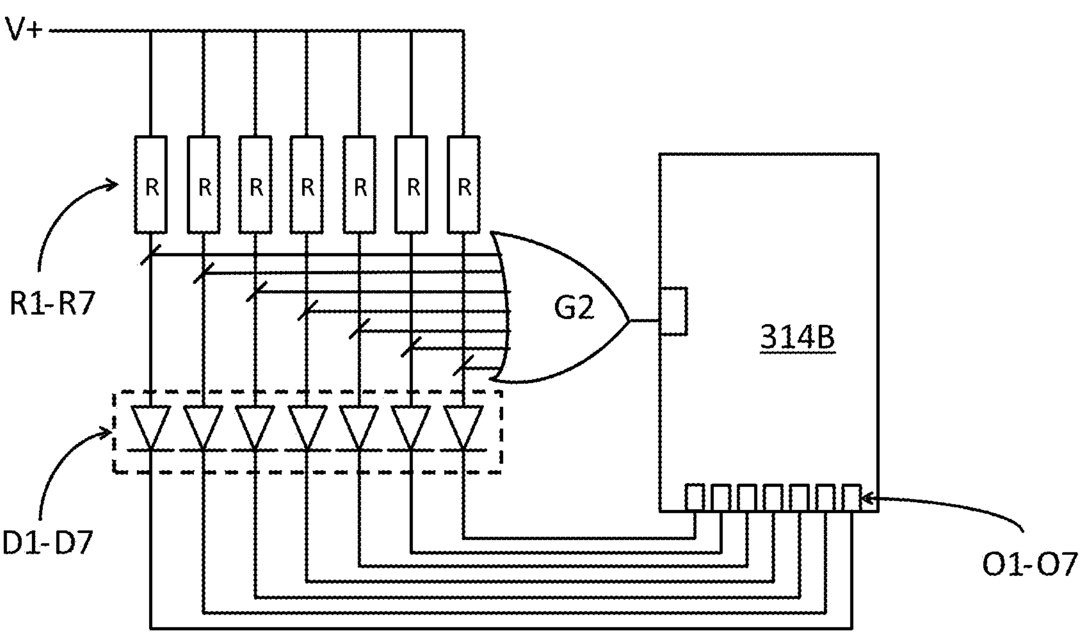

For another example, compared to the example in FIG. 2B, in FIG. 3B, the operating levels collected between each LED and the voltage dividing resistor are first input to the OR circuit G2 for logical operation, and then the operation result is input to an I/O port of the detection device 314B. When all the LEDs D1-D7 work normally, the collected operating levels are all low, so the result of the OR gate operation will also be low; if any one of the LEDs D1-D7 is not working normally, there will be a high level in the collected operating level, so the result of the OR gate operation will also be high. Therefore, the working status of the elevator display module can be determined according to the result of the logic operation.

In the examples described above with reference to FIGS. 2A, 2B, 3A, and 3B, in addition to using a drive signal as a detection signal, a reset signal can also be used. Specifically, the processor of the detection device can reset the electroluminescent device of the elevator display module in response to the detection request signal. For example, taking FIG. 2A as an example, reset signals (such as low-level signals) can be sent to the LEDs D1-D7 through the I/O ports O1-O7. At this time, the collected levels from I1-I7 should be low level, if any one of them is not low, it indicates that the LED may be faulty. The reset operation of the elevator display module can detect whether there is an LED in the elevator display module that cannot be set to a low level. If such an LED exists, it indicates that the elevator display module is faulty.

According to another aspect of the present application, an elevator system is provided, including an elevator control cabinet (for example, the elevator control cabinet in FIGS. 4A-4C) and a detection device (for example, the detection device shown in FIGS. 1, 2A, 2B, 3A and 3B). In one implementation, the elevator control cabinet 416 is configured to periodically send a detection request signal to the detection device, and receive and store a message about whether the detected electroluminescent device is working normally sent by the detection device. In another implementation, the elevator control cabinet is configured to, in response to the elevator display module test request from the user terminal or remote server, send a detection request signal to the detection device, receive and forward to the user terminal or the remote server the message about whether the detected electroluminescent device is working normally sent by the detection device.

Figure 4A:
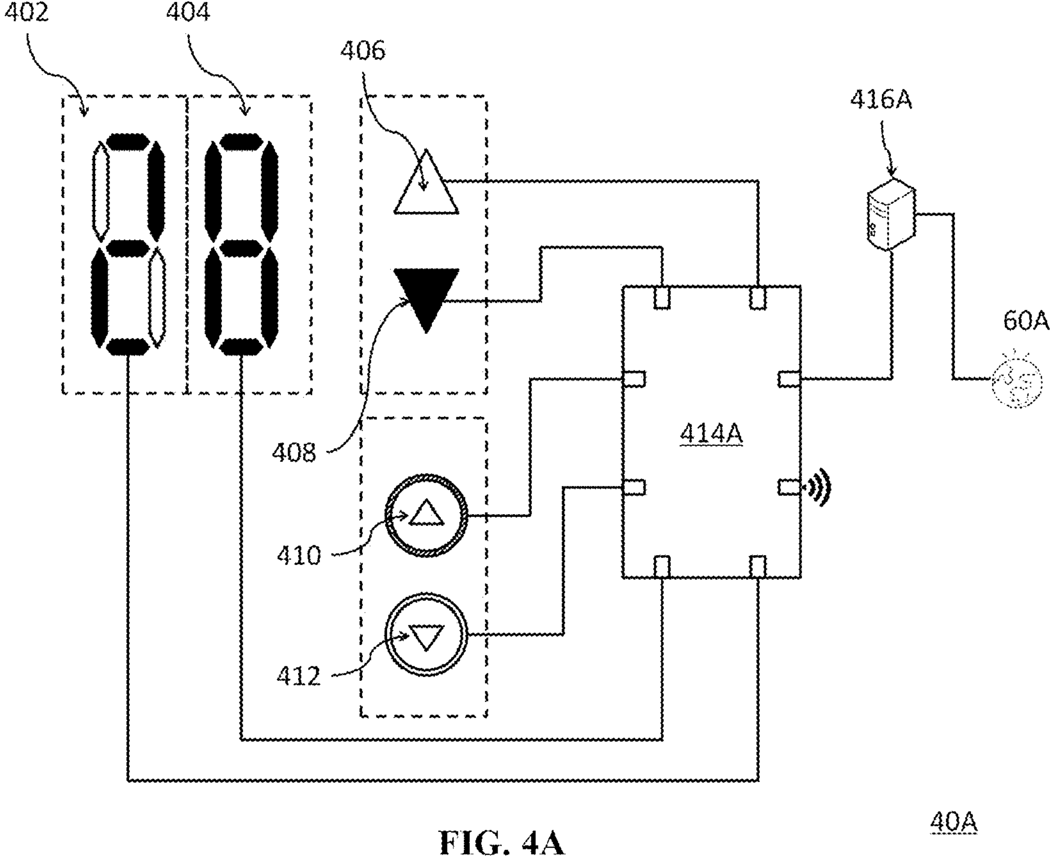
FIGS. 4A, 4B and 4C schematically show an elevator system according to embodiments of the present application.
Figure 4B:
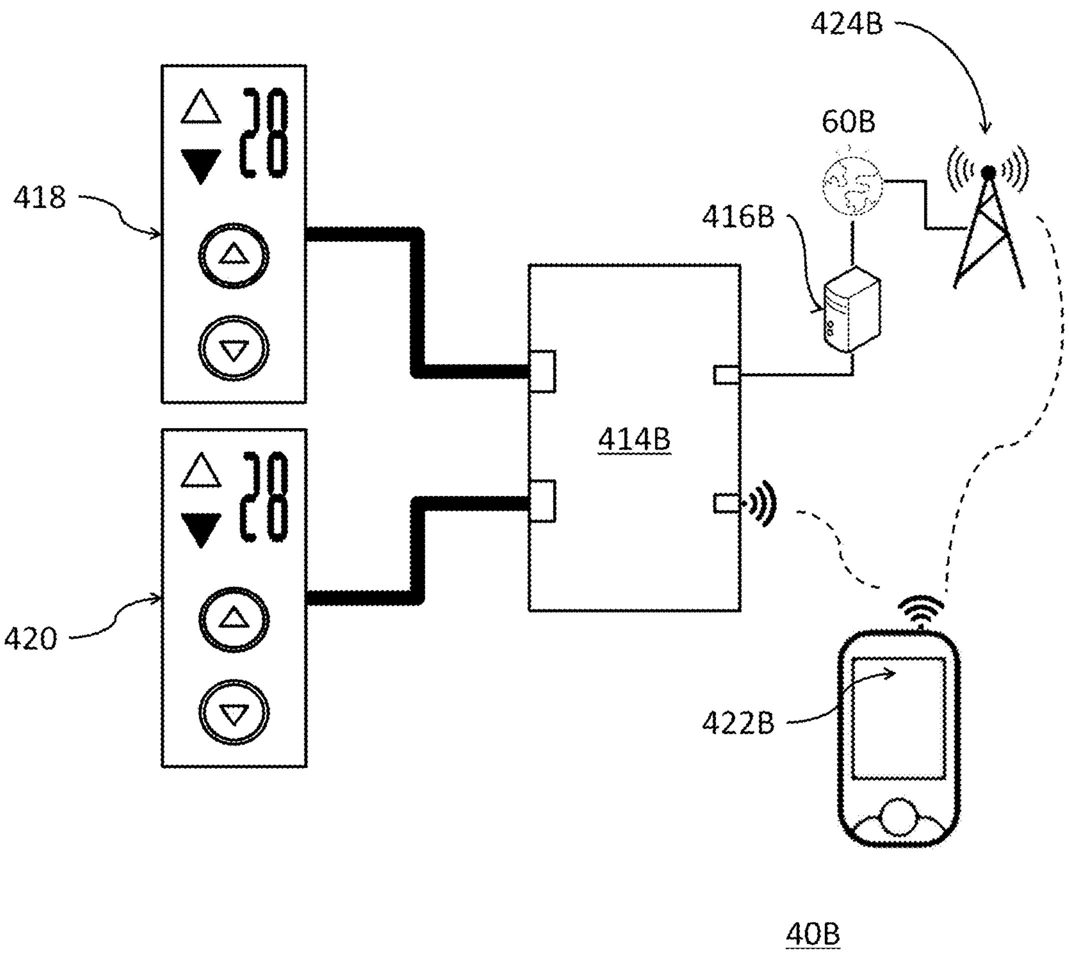
Figure 4C:
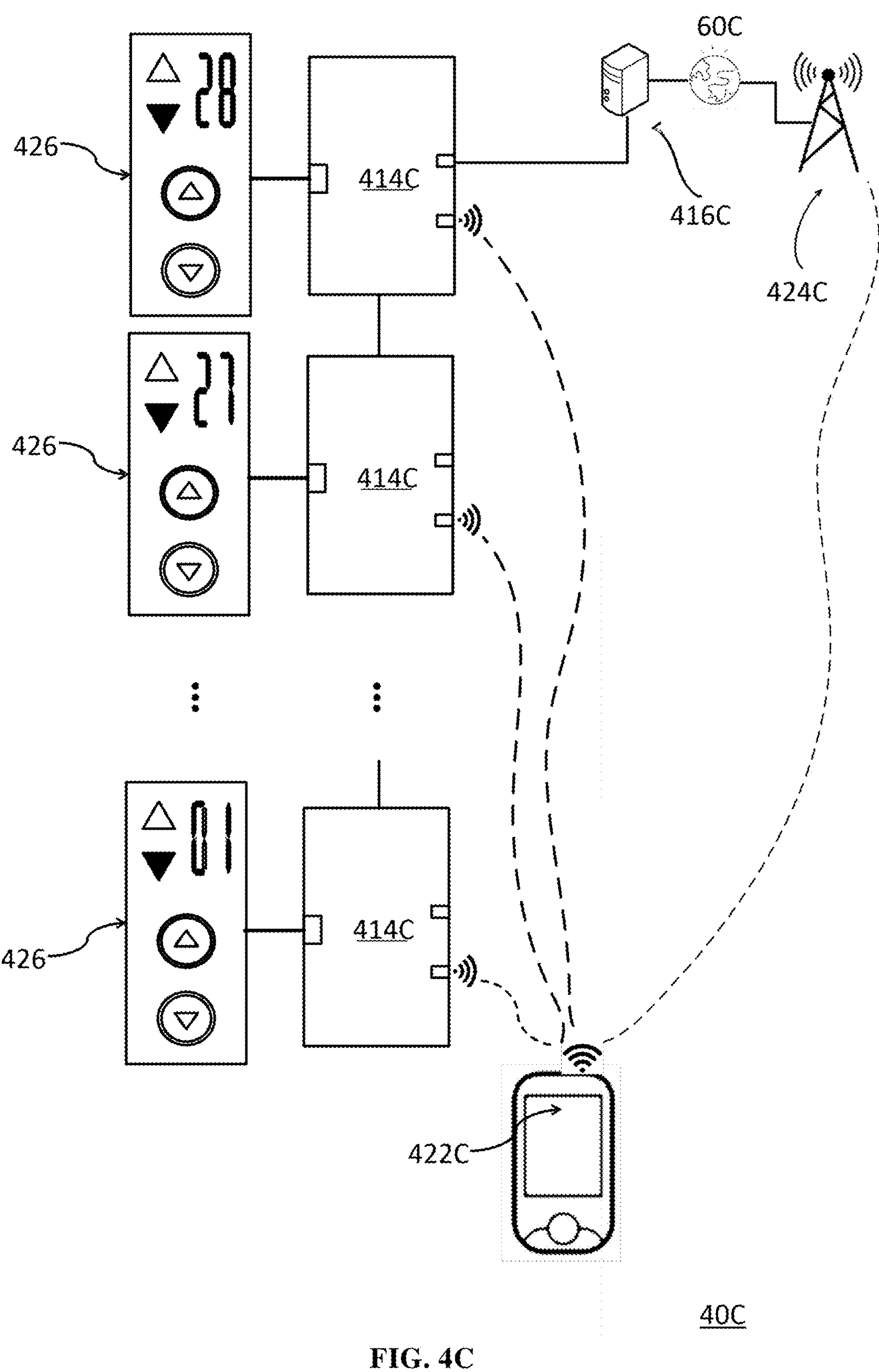

FIGS. 4A, 4B and 4C schematically show an elevator system according to embodiments of the present application.

In the elevator system 40A shown in FIG. 4A, the elevator display module may be one or more of a seven-segment digital tube, a rice-shaped digital tube, a direction indicating module, and a button status module. FIG. 4A shows various forms of elevator display modules, including: high-order seven-segment digital tube 402 and low-order seven-segment digital tube 404 for displaying floors, instead of the seven-segment digital tube, it can also be a rice-shaped digital tube in occasions with higher display requirements; the upward indicator light 406 and the downward indicator light 408 used to display the operating direction of the elevator, which together constitute the direction indicator module of the elevator system; the upward button indicator light 410 and the downward button indicator light 412 used to prompt button operation, which together constitute the button status module of the elevator system. As shown in FIG. 4A, the elevator display modules 402, 404, 406, 408, 410, and 412 are electrically coupled to the I/O port of the detection device 414A. The detection device 414A determines its working status by applying a test signal on the LED of the elevator display module and obtaining the operating level associated with the LED.

Referring to FIG. 4A, the detection device 414A of the elevator system 40A can receive the detection request signal from the elevator control cabinet 416A of the elevator system. In addition, if the elevator control cabinet 416A has the ability to access the external network 60A (for example, the Internet, mobile communication network, etc.), the external devices (for example, remote servers, user terminals, etc.) can transmit the detection request signal via the external network and the elevator control cabinet to the detection device 414A. In addition, the detection device 414A may be equipped with a wireless communication function (for example, Bluetooth communication function, Wi-Fi communication function), at this time, the detection request signal may also be directly transmitted from the user terminal to the detection device 414A via a wireless channel.

Optionally, the detection request signal is generated periodically or triggered by an event. In some examples, the detection request signal sent to the detection device 414A may be periodically generated by the elevator control cabinet 416A at a fixed time interval, so that the test device 414 periodically detects the working status of the elevator display module, so that the maintenance personnel can replace the damaged elevator display module at a time. In addition, the detection request signal sent to the detection device 414A may be triggered by an event. For example, after the elevator system is powered on again, the elevator control cabinet 416A may send a detection request signal to the detection device 414A. After the elevator display module is powered on again, the detection device can detect the damaged elevator display module to prevent the elevator system from being in a degraded service status.

In some application scenarios, it may be desirable to configure the test device to detect elevator display modules on the same hall floor of multiple elevators. FIG. 4B is a schematic diagram of an elevator system that can be applied to such scenarios. Exemplarily, FIG. 4B only shows the test device on one of the floors.

As shown in FIG. 4B, the I/O port of the detection device 414B (for example, the elevator control module) of the elevator system 40B is connected with the display modules 418 and 420 on the same floor of the two elevators. The detection device 414B determines its working status by applying a test signal on the LED of the elevator display module and obtaining the operating level associated with the LED.

Referring to FIG. 4B, the user terminal 422B may send a detection request signal for the display modules of two elevators to the detection device 414B. Exemplarily, the user terminal 422B may directly send a detection request signal to the detection device 414B through a Bluetooth channel or a Wi-Fi channel In other examples, the user terminal 422B may also establish a communication connection with the elevator control cabinet 416B through the wireless base station 424B of a mobile communication system (for example, a 4G or 5G mobile communication system) via the external network 60B, and thereby send a detection request signal to the detection device 414B via the elevator control cabinet 416B. In still other examples, a remote server (not shown) may establish a communication connection with the elevator control cabinet 416B via the external network 60B, so as to send a detection request signal to the detection device 414B via the elevator control cabinet 416B. In response to the received detection request signal, the detection device can determine the working status of the electroluminescent device by applying a detection signal on the electroluminescent device in the display module 418, 420 and obtaining the associated operating level. Optionally, the detection device 414B may return the result of the determination to the requester of the detection request signal.

In some other application scenarios, it may be desirable to configure the test device to detect elevator display modules on multiple hall floors of an elevator. FIG. 4C shows an exemplary elevator system that can be applied to such scenarios.

As shown in FIG. 4C, the elevator system 40C includes a detection device 414C (for example, an elevator control module), each of which is configured to test the elevator display module 426 of the corresponding floor. In the elevator system shown in FIG. 4C, a plurality of detection devices 414C are connected in series and one of them is connected with the elevator control cabinet 416C, thereby forming a signal link between the detection device and the elevator control cabinet, and any one of the detection devices can establish a communication connection with the elevator control cabinet via the communication link.

Optionally, each detection device 414C is also equipped with a wireless communication capability to communicate with the elevator control cabinet 416C or the user terminal 422C in a wireless manner.

Referring to FIG. 4C, taking one floor as an example, the I/O port of the corresponding detection device 414C is connected with the display module 426 of the floor. The detection device 414C determines its working status by applying a test signal on the LED of the elevator display module 426 and obtaining the operating level associated with the LED.

The user terminal 422C may directly send a detection request signal to one or more of the multiple detection devices 414C in a wireless manner (for example, as described above, equipment identification of the elevator display module or the detection device may be included in the detection request signal) to instruct the elevator display module of the corresponding floor to be tested. On the other hand, the user terminal 422C or a remote server (not shown) can also establish a communication connection with the elevator control cabinet 416C via the wireless base station 624C of the mobile communication network, so as to send a detection request signal to one or more of the multiple detection devices 414C via the elevator control cabinet 416C (equipment identification of the elevator display module or the detection device may also be included in the detection request signal) to instruct the elevator display module of the corresponding floor to be tested. In response to the received detection request signal, the detection device 414C can determine the working status of the electroluminescent device by applying a detection signal on the electroluminescent device in the display module 426 and obtaining the associated operating level. Optionally, the detection device 414C may return the result of the determination to the requester of the detection request signal.

Figure 5:
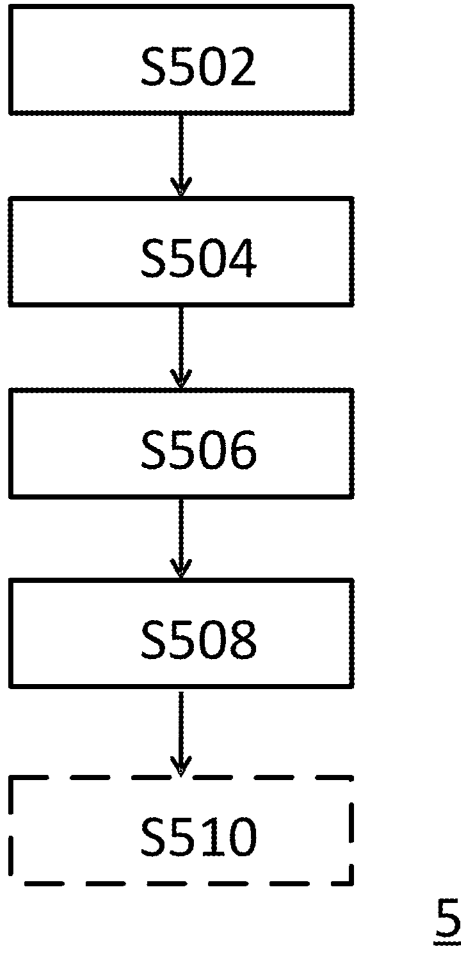
FIG. 5 schematically shows a flowchart of a detection method for an elevator display module according to an embodiment of the present application.

FIG. 5 is a schematic diagram of a detection method for an elevator display module according to an embodiment of the present application. Exemplarily, the detection method 50 shown in FIG. 5 may be executed by the above-mentioned test device (for example, the detection device shown in FIGS. 1, 2A, 2B, 3A, and 3B).

The detection method 50 for elevator display modules shown in FIG. 5 comprises the following steps:

Step S502: The detection device receives a detection request signal for the elevator display module. When the maintenance personnel need to detect the elevator display module in the elevator system, they can send a detection request signal to the detection device connected with the elevator display module, and the detection device performs the detection operation according to the received detection request signal. Since the detection request signal can be sent to the detection device via the elevator control cabinet in a remote way, there is no need for maintenance personnel to visit the site to perform the detection operation. In addition, the maintenance personnel can also send a detection request signal to the detection device through communication technologies such as Wi-Fi and Bluetooth while on site.

Step S504: Apply a detection signal on one or more electroluminescent devices of the elevator display module according to the detection request signal. Optionally, after receiving the detection request signal for the elevator display module, it will be determined whether the elevator display module corresponds to the equipment identification in the detection request signal. If the elevator display module corresponds to the equipment identification in the detection request signal, the electroluminescent device specified in the detection request signal can be detected. If the detection device has sufficient port resources, the detection of the electroluminescent device can be performed at the same time (for example, a test signal can be applied on a plurality of electroluminescent devices). Optionally, test signals can also be applied to a plurality of electroluminescent devices in sequence to save the consumption of port resources. Exemplarily, when one of the electroluminescent devices of the elevator display module is damaged, it can be determined that the entire elevator display module is damaged; only when all the electroluminescent devices are working normally, the elevator display module is determined to be normal.

Step S506: Obtain the operating level associated with the electroluminescent device specified for testing. After applying a test signal (for example, a drive signal or a reset signal) to the electroluminescent device in step S504, the operating level of the electroluminescent device can be collected respectively. In some examples, the level signals collected from the electroluminescent device may be logically combined, and the combined signal may be output as an operating level to the detection device to save the consumption of port resources.

Step S508: The detection device determines whether the detected electroluminescent device is working normally according to the polarity of the operating level. The specific determination method has been described in detail above, and will not be repeated here.

Exemplarily, a response signal indicating the working status of the elevator display module can be generated. For example, when each electroluminescent device in the elevator display module is normal, the response signal can indicate that the elevator display module is working normally at this time. If any electroluminescent device in the elevator display module does not work normally, the response signal can indicate that the elevator display module is faulty at this time. The generated response signal can be stored in a predetermined location, and the maintenance personnel can read the response signal from the predetermined location to analyze the working status of the elevator display module.

Optionally, the method shown in FIG. 5 further includes a step 510 of sending a message about whether the detected electroluminescent device is working normally to the user terminal or the elevator control cabinet. For example, the response signal generated in step S508 may be returned to the user terminal or elevator control cabinet that sends the detection request signal.

According to another aspect of the present application, there is provided a computer-readable storage medium having instructions stored in the computer-readable storage medium, when the instructions are executed by a processor, the processor is caused to execute any detection method for elevator display module as described above. The computer-readable medium referred to in this application includes various types of computer storage media, and may be any available medium that can be accessed by a general-purpose or special-purpose computer. For example, the computer-readable medium may include RAM, ROM, EPROM, $E^2$PROM, registers, hard disks, removable disks, CD-ROM or other optical disk storage, magnetic disk storage or other magnetic storage devices, or can be used to carry or store a desired program code unit in the form of instructions or data structures and any other transitory or non-transitory medium that can be accessed by a general-purpose or special-purpose computer or a general-purpose or special-purpose processor. Disks as used herein usually copy data magnetically, while discs use lasers to optically copy data. The above combination should also be included in the protection scope of the computer-readable medium. An exemplary storage medium is coupled to the processor such that the processor can read and write information from and to the storage medium. In the alternative, the storage medium may be integrated into the processor. The processor and the storage medium may reside in the ASIC. The ASIC may reside in the user terminal. In the alternative, the processor and the storage medium may reside as discrete components in the user terminal.

The above are only specific implementation of this application, but the protection scope of this application is not limited thereto. Those skilled in the art can think of other feasible changes or substitutions according to the technical scope disclosed in this application, and these changes or substitutions are all covered by the protection scope of this application. In the case of no conflict, the implementations of the application and the features in the implementations can also be combined with each other. The protection scope of this application is subject to the description of the claims.

What is claimed is:

1. A detection device for an elevator display module, comprising:

memory;

a processor;

an I/O interface, configured to be coupled with one or more electroluminescent devices of the elevator display module;

a communication module; and a computer program stored on the memory and running on the processor, the running of the computer program causes:

receiving a detection request signal for the elevator display module via the communication module;

in response to the detection request signal, applying a detection signal on at least one of the electroluminescent devices via the I/O interface;

obtaining an operating level associated with the detected electroluminescent device via the I/O interface; and determining whether the detected electroluminescent device is working normally according to a polarity of the operating level;

wherein applying the detection signal on at least one of the electroluminescent devices via the I/O interface comprises applying a high voltage level to an anode of the at least one of the electroluminescent devices, wherein determining that the detected electroluminescent device is working normally occurs in response to detecting a high voltage at a cathode of the detected electroluminescent device; or wherein applying the detection signal on at least one of the electroluminescent devices via the I/O interface comprises applying a low voltage level to a cathode of the at least one of the electroluminescent devices, wherein determining that the detected electroluminescent device is working normally occurs in response to detecting a low voltage at an anode of the detected electroluminescent device.

2. The detection device according to claim 1, wherein the detection device is an elevator control module for realizing elevator dispatching and control functions or a device dedicated to controlling elevator display.

3. The detection device according to claim 1, wherein the communication module is configured to receive the detection request signal from a user terminal via a wireless network, or receive the detection request signal from an elevator control cabinet of an elevator system via a wireless network or a wired network.

4. The detection device according to claim 1, wherein the detection request signal includes an equipment identification of the elevator display module or the detection device.

5. The detection device according to claim 1, wherein the detection request signal includes an identification of the electroluminescent device in the elevator display module.

6. The detection device according to claim 3, wherein the running of the computer program further causes:

sending a message about whether the detected electroluminescent device is working normally to the user terminal or the elevator control cabinet via the communication module.

7. The detection device according to claim 1, wherein the electroluminescent device is a light emitting diode, the I/O interface includes a plurality of first ports and a plurality of second ports, each of the first ports is configured to be coupled with the first end of the respective corresponding light emitting diode to apply the detection signal, and each of the second ports is configured to be coupled with the second end of the respective corresponding light emitting diode to obtain the operating level.

8. The detection device according to claim 1, wherein further comprising a combinational logic circuit, the electroluminescent device is a light emitting diode, and the I/O interface includes a plurality of first ports and one or more second ports, each of the first ports is configured to be coupled with the first pole of the respective corresponding light emitting diode to apply the detection signal, and an input terminal of the combinational logic circuit is configured to be coupled with the second pole of the plurality of light emitting diodes, at least one of the second ports is configured to be coupled with an output terminal of the combinational logic circuit to obtain the operating level.

9. The detection device according to claim 1, wherein the detection signal is a drive signal or a reset signal.

10. An elevator system, comprising:

elevator control cabinet; and a plurality of detection devices according to claim 1.

11. The elevator system according to claim 10, wherein the elevator control cabinet is configured to periodically send the detection request signal to the detection device, and receive and store a message about whether the detected electroluminescent device is working normally sent by the detection device.

12. The elevator system of claim 10, wherein the elevator control cabinet is configured to, in response to an elevator display module test request from a user terminal or a remote server, send the detection request signal to the detection device, receive and forward to the user terminal or the remote server the message about whether the detected electroluminescent device is working normally sent by the detection device.

13. A detection method for an elevator display module, the elevator display module includes one or more electroluminescent devices, and the detection method comprises the following performed by a detection device:

receiving a detection request signal for the elevator display module;

in response to the detection request signal, applying a detection signal on at least one of the electroluminescent devices;

obtaining an operating level associated with the detected electroluminescent device; and determining whether the detected electroluminescent device is working normally according to a polarity of the operating level;

wherein applying the detection signal on at least one of the electroluminescent devices via the I/O interface comprises applying a high voltage level to an anode of the at least one of the electroluminescent devices, wherein determining that the detected electroluminescent device is working normally occurs in response to detecting a high voltage at a cathode of the detected electroluminescent device; or wherein applying the detection signal on at least one of the electroluminescent devices via the I/O interface comprises applying a low voltage level to a cathode of the at least one of the electroluminescent devices, wherein determining that the detected electroluminescent device is working normally occurs in response to detecting a low voltage at an anode of the detected electroluminescent device.

14. The detection method according to claim 13, wherein the detection method is performed by an elevator control module for realizing elevator dispatching and control functions or a device dedicated to controlling elevator display.

15. The detection method according to claim 13, wherein the detection request signal is received from a user terminal via a wireless network, or the detection request signal is received from an elevator control cabinet of an elevator system via a wireless network or a wired network.

16. The detection method according to claim 13, wherein the detection request signal includes an equipment identification of the elevator display module or the detection device.

17. The detection method according to claim 13, wherein the detection request signal includes an identification of the electroluminescent device in the elevator display module.

18. The detection method according to claim 15, further comprising:

sending a message about whether the detected electroluminescent device is working normally to the user terminal or the elevator control cabinet.

19. The detection method according to claim 13, wherein the detection signal is a drive signal or a reset signal.

20. A non-transitory computer-readable storage medium having instructions stored in the non-transitory computer-readable storage medium, wherein, when the instructions are executed by a processor, the processor is caused to execute the detection method according to claim 13.

* * * * *